(12) United States Patent
Hurwitz et al.

(10) Patent No.: US 10,845,393 B2
(45) Date of Patent: Nov. 24, 2020

(54) CURRENT MEASUREMENT

(71) Applicant: Analog Devices Global Unlimited Company, Hamilton (BM)

(72) Inventors: Jonathan Ephraim David Hurwitz, Edinburgh (GB); William Michael James Holland, Edinburgh (GB); Seyed Amir Ali Danesh, Edinburgh (GB)

(73) Assignee: Analog Devices International Limited Company, Limerick (IE)

( * ) Notice: Subject to any disclaimer, the term of this patent is extended or adjusted under 35 U.S.C. 154(b) by 0 days.

(21) Appl. No.: 15/700,867

(22) Filed: Sep. 11, 2017

(65) Prior Publication Data

US 2019/0079117 A1 Mar. 14, 2019

(51) Int. Cl.
*G01R 15/20* (2006.01)
*G01R 19/00* (2006.01)
*G01R 19/25* (2006.01)
*G01R 21/133* (2006.01)
*G01R 35/04* (2006.01)
(Continued)

(52) U.S. Cl.
CPC ........... *G01R 15/202* (2013.01); *G01R 1/203* (2013.01); *G01R 15/146* (2013.01); *G01R 15/207* (2013.01); *G01R 19/0092* (2013.01); *G01R 19/2509* (2013.01); *G01R 21/08* (2013.01); *G01R 21/133* (2013.01); *G01R 33/3607* (2013.01); *G01R 35/02* (2013.01); *G01R 35/04* (2013.01); *G01R 19/32* (2013.01); *G01R 21/14* (2013.01)

(58) Field of Classification Search
CPC ................ G01R 15/202; G01R 21/133; G01R 19/2509; G01R 35/04; G01R 35/02; G01R 1/203; G01R 21/08; G01R 19/0092; G01R 15/207; G01R 15/146; G01R 33/3607; G01R 21/14; G01R 19/32
See application file for complete search history.

(56) References Cited

U.S. PATENT DOCUMENTS 6,144,924 A * 11/2000 Dowling .............. G01R 31/343
702/60
2004/0134267 A1* 7/2004 Boesch .................. H02K 21/00
73/114.62
(Continued)

FOREIGN PATENT DOCUMENTS

| WO | WO-2013038176 A2 | 3/2013 |
| WO | WO-2014191776 A1 | 12/2014 |
| WO | 2019048537 | 3/2019 |

OTHER PUBLICATIONS

"International Application Serial No. PCT EP2018 073984, Written Opinion dated Nov. 30, 2018", 7 pgs.
(Continued)

*Primary Examiner* — Patrick Assouad
*Assistant Examiner* — Haidong Zhang
(74) *Attorney, Agent, or Firm* — Schwegman Lundberg & Woessner, P.A.

(57) ABSTRACT

A measurement circuit is arranged to make several measurements, either at different times or in respect of different frequency components of currents measured by current sensors in respective phases of a multiphase supply system. The measurements are then used to correct for discrepancies in the transfer function of the sensors.

20 Claims, 9 Drawing Sheets

(51) Int. Cl.
  *G01R 35/02*  (2006.01)
  *G01R 1/20*   (2006.01)
  *G01R 15/14*  (2006.01)
  *G01R 21/08*  (2006.01)
  *G01R 33/36*  (2006.01)
  *G01R 21/14*  (2006.01)
  *G01R 19/32*  (2006.01)

(56) References Cited

U.S. PATENT DOCUMENTS

| | | |
|---|---|---|
| 2015/0219692 A1 | 8/2015 | Krah et al. |
| 2016/0154029 A1 | 6/2016 | Danesh et al. |
| 2016/0291060 A1 | 10/2016 | Wood et al. |

OTHER PUBLICATIONS

"International Application Serial No. PCT EP2018 073984, International Search Report dated Nov. 30, 2018", 4 pgs.

Ziegler, Silvio, et al., "Current Sensing Techniques: A Review", IEEE Sensors Journal, vol. 9, No. 4, (Apr. 2009), 354-376.

\* cited by examiner

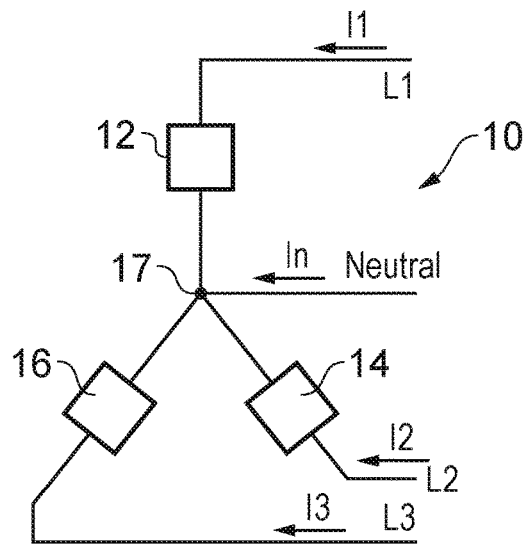
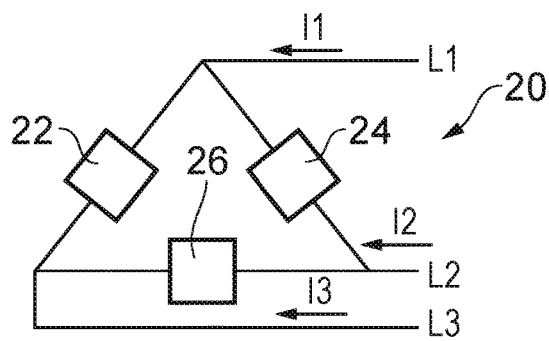
FIG. 1    FIG. 2
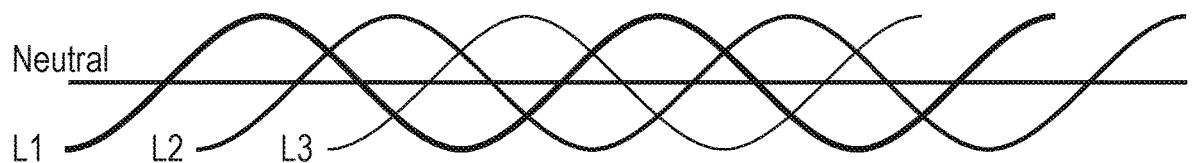
FIG. 3
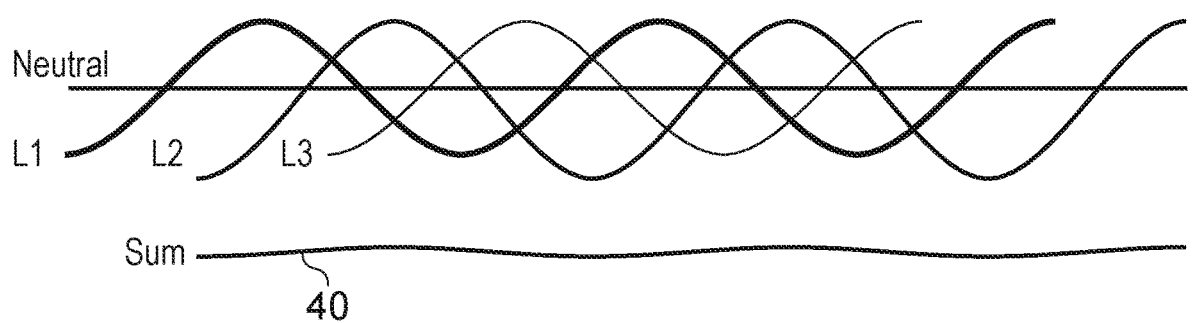
FIG. 4

$$F_1 C_{1c} + F_2 C_{2c} + F_3 C_{3c} + F_n C_{nc} = 0$$

$$\begin{cases} F_1 = \dfrac{F_2 C_{2a} + F_3 C_{3a} + F_n C_{na}}{-C_{1a}} \\ \\ F_2 = \dfrac{F_3(C_{1a}C_{3b} - C_{1b}C_{3a}) + F_n(C_{1a}C_{nb} - C_{1b}C_{na})}{C_{1b}C_{2a} - C_{2b}C_{1a}} \end{cases}$$

$$\Rightarrow F_3 = \dfrac{F_1 C_{1c} + F_2 C_{2c} + F_n C_{nc}}{-C_{3c}}$$

$$\dfrac{\dfrac{F_3(C_{1a}C_{3b} - C_{1b}C_{3a}) + F_n(C_{1a}C_{nb} - C_{1b}C_{na})}{C_{1b}C_{2a} - C_{2b}C_{1a}} C_{2a} + F_3 C_{3a} + F_n C_{na}}{-C_{1a}} C_{1c} + \dfrac{F_3(C_{1a}C_{3b} - C_{1b}C_{3a}) + F_n(C_{1a}C_{nb} - C_{1b}C_{na})}{C_{1b}C_{2a} - C_{2b}C_{1a}} C_{2c} + F_n C_{nc}$$

$$\Rightarrow F_3 = \dfrac{}{-C_{3c}}$$

$$\Rightarrow \dfrac{F_3}{F_n} = \dfrac{(C_{1a}C_{nb}C_{2a}C_{1c} - C_{1b}C_{na}C_{2a}C_{1c} + C_{na}C_{1c}C_{1b}C_{2a} - C_{1a}C_{1c}C_{1b}C_{2a} - C_{1a}C_{nb}C_{1b}C_{2c} - C_{1a}C_{nc}C_{1b}C_{2a} + C_{1a}C_{nc}C_{2b}C_{1a} - C_{1b}C_{na}C_{2b}C_{1a})}{(C_{3c}C_{1a}C_{1b}C_{2a} - C_{3c}C_{1a}C_{1b}C_{2a} - C_{2a}C_{1c}C_{1a}C_{3b} + C_{2a}C_{1c}C_{1b}C_{3a} - C_{1b}C_{2a}C_{1c}C_{3a} - C_{1b}C_{2a}C_{3a}C_{1c} + C_{3a}C_{1c}C_{2b}C_{1a} + C_{1a}C_{3b}C_{1a}C_{2c} - C_{1b}C_{3a}C_{1a}C_{2c})}$$

FIG. 9

CURRENT MEASUREMENT

TECHNICAL FIELD

The present document relates to current measurement apparatus which is configured to measure current in conductors of a multi-phase electricity supply and to a current measurement method therefor. The present subject matter further relates to a multi-phase electricity supply arrangement comprising such current measurement apparatus.

BACKGROUND

It is desirable to measure the current being supplied to a load, for example for billing purposes or for safety monitoring. Various current measurement devices include current shunts, current transformers, Rogowski coils, Hall effect devices and so on.

A current shunt provides for indirect measurement of current values by measurement of the voltage developed across the current shunt by the current passing through the current shunt. In use a current shunt of known resistance is provided in series with a load and the voltage developed across the current shunt by the load drawn current is measured. The current passing through the current shunt is then determined on the basis of Ohm's Law in view of the measured voltage and the known resistance of the shunt.

Thus if the voltage measured across the shunt is Vs and the transfer function of the shunt is Fs then the current Is can be calculated from Is=Vs*Fs. This concept can be extended to include the transfer characteristic of a signal processing chain acting on the voltage developed across the shunt. For example the voltage signal from the shunt may be subject to gain prior to being digitized. These scaling factors need to be taken into account.

SUMMARY

Certain applications, such as metering of electricity consumption and generation, require measurement to high accuracy over extended periods of time. For example in North America the ANSI C12.20 standard specifies an accuracy of ±0.5% for Class 0.5 consumption meters and ±0.2% for Class 0.2 consumption meters. Standards applicable in Europe and elsewhere, such as IEC 62053, specify similar accuracy requirements. It can therefore be appreciated that the resistance of the current shunt must be known to high precision to enable a meter to meet regulated accuracy requirements. Although the shunt resistance is normally low to minimise power dissipation and undesirable circuit effects, the current shunt is nevertheless liable to heating with temperature drift giving rise to a change in resistance which may cause a loss of measurement accuracy in a shunt of ordinary temperature coefficient of resistance. Shunt resistors formed from manganin alloy are therefore widely used in view of their very low temperature coefficient of resistance. It may also be apparent that accurate current measurement depends on measurement of the voltage developed across the shunt being accurate and stable with temperature and lifetime. This is because a change in the transfer gain of the voltage measurement circuit or lack of precision in references used in the voltage measurement circuit will cause an error. It is normal for these reasons to perform a one-off factory calibration when the current shunt and the readout electronics are combined so that a factor related to the actual combined transfer function for current to measurement value, which is determined largely by the shunt resistor and voltage measurement, can be stored and used in subsequent measurements to achieve the desired precision.

An alternative approach to measuring high values of current involves the use of a current transformer wound on a core, which is disposed around a conductor carrying current to be measured. The current transformer has the advantages over the shunt resistor of being less invasive and providing for isolation from the current carrying conductor. The current transformer is capable of measuring AC current only. The current transformer generates a current in the secondary coil, which is a ratio of the current in the primary conductor, and the secondary coil current is then turned into a voltage by a load, referred to as a burden resistor. Accurate measurement of the voltage across the burden resistor and accurate knowledge of the transfer function of the primary current to voltage across the burden resistor (i.e. combining the effect of number of turns, the magnetics and the burden resistor) are needed to measure the current accurately and precisely. As with the current shunt, one-off factory calibration is often performed to compensate for inaccuracies in some or all of the elements that contribute to the overall transfer function of primary current to measurement value.

Another approach uses a Hall current probe which is capable of measuring both AC and DC. In an open loop configuration the Hall current probe is, however, liable to non-linearity and temperature drift. In a closed loop configuration the Hall current probe provides an improvement with regards to non-linearity and temperature drift although the weight and size of the configuration increases significantly where higher currents are measured. The Rogowski coil current probe can be used to measure high levels of current. Approaches to current measurement, such as by way of the shunt resistor, the current transformer, the Rogowski coil and the Hall current probe, are described and discussed in *Current Sensing Techniques: A Review*, Silvio Ziegler Robert C. Woodward and Herbert Ho-Ching Iu, IEEE Sensors Journal, Vol. 9, No. 4, April 2009. The different approaches have their respective advantages and disadvantages.

Load current measurement is often made in conjunction with line voltage measurement, which involves measuring the voltage between the conductors over which the current is delivered, in order to determine the electrical power. Often a resistive potential divider between the conductors is employed for line voltage measurement. High accuracy power calculation requires accurate and stable relative phase and frequency response of load current and line voltage measurements in order to accurately determine metrics such as the like of power factor, harmonic content and differences between active and reactive power amongst other things.

WO 2013/038176 describes an improved approach to the measurement of current. According to the approach of WO 2013/038176 a current sensor, such as a current shunt, a current transformer, a Hall current probe or a Rogowski coil, is disposed, as described above, in association with a conductor to sense a load drawn current flowing through the conductor. A reference signal with a sufficiently high precision is applied to the current sensor such that the current sensor is responsive to both the load drawn current signal and the applied reference signal. The output signal from the current sensor is acquired and the part of the output signal corresponding to the reference signal is extracted from the output signal. Then the transfer function of the current sensor and the current sensor processing chain is determined on the basis of the reference signal and the extracted part of the output signal corresponding to the reference signal. Thereafter the actual load drawn current flowing through the conductor is determined using the transfer function and the load drawn current as sensed by the current sensor. Accuracy of measurement of the load drawn current therefore depends on the reference signal being known to a significantly high precision instead of the performance of the current sensor and its processing chain being known to high precision. The lack of reliance on the known precision of the current sensor means a lower quality sensor may be used. Furthermore the approach of WO 2013/038176 addresses drift of the current sensor and its processing chain arising from the like of ageing and temperature change and also provides for additional functionality, such as the detection of tampering with electricity consumption meters.

The approach of WO 2013/038176 relies on the capability to extract the part of the output signal corresponding to the reference signal properly from the rest of the output signal and normally under circumstances where the reference signal is of much smaller amplitude than the load current signal. Although the apparatus of WO 2013/038176 is configured to change the characteristics of the reference signal to improve upon proper extraction of the part of the output signal corresponding to the reference signal, under certain circumstances the reference signal and the load current signal share characteristics which present an obstacle to the signal extraction process.

WO 2013/038176 describes an approach to address this problem which involves the removal of the load current signal from the output signal. More specifically the approach comprises making a second measurement of the load current signal which lacks the applied reference signal to provide a second output signal and subtracting the second output signal from the first output signal to leave the part of the first output signal corresponding to the reference signal. WO 2013/038176 describes how this approach can be realised by way of two current sensors in the same conductor, e.g. the live conductor, or with one current sensor in the live conductor and the other current sensor in the neutral conductor and where the reference signal is applied to one of the two current sensors only.

The present inventors have considered extending the approach of removing the load current signal from the output signal to multi-phase configurations and have become appreciative of obstacles to the ease of doing so. Considering the configuration of WO 2013/038176 which comprises one current sensor in the live conductor and another current sensor in the neutral conductor, an alternative way of expressing the approach described in WO 2013/038176 will now be described. The live current sensor has a transfer function F1 and the neutral current sensor has a transfer function FN. When no reference signal is applied to either current sensor, the ratio of a measurement M1 made by the live current sensor and a measurement MN made by the second current sensor is equal to the ratio of F1 and FN assuming the live current returns on the neutral conductor. The ratio, K, of the transfer functions can thus be determined on the basis of measurements made by the two current sensors. The ratio, K, is therefore determined on the basis of one independent equation, i.e. F1*M1+FN*MN=0 whereby K=F1/FN=−MN/M1. Having determined the ratio of the transfer functions, a reference signal is applied to one of the two current sensors, e.g. the current sensor in the live conductor. The output signals from the two current sensors are measured. The transfer function of the current sensor to which the reference signal is applied, e.g. F1, can then be determined as a function of the two output signals, the earlier determined ratio, K, of transfer functions and the reference signal alone. The process thus involves removing the load current signal from the determination of the transfer function of the current sensor to which the reference signal is applied. A worked example of this process is given later on (with respect to equations 1 to 14) to aid the reader.

The present inventors have appreciated that the above described approach for a single phase electricity supply does not extend to being used in a multiphase supply without subtle modification being made.

According to a first aspect of this disclosure there is provided a current measurement apparatus for use in a multiphase electricity supply comprising at least two current measurement transducers. The current measurement apparatus includes means for determining ratios of transfer functions of transducers in different phases of the mutliphase supply. The means for determining the ratios may comprise a data processor arranged to determine ratios of transfer functions of the at least two current measurement transducers by comparing plural measurements of current and determining the ratio of the transfer functions by application of Kirchoffs law of current flow.

It is worthwhile setting out the problems that occur in a multiphase system which do not arise in a single phase system.

From Kirchhoff's current law the sum of currents in the live phases and neutral is zero in an ideal multi-phase configuration (with no ground faults). For example in a three phase plus neutral configuration the sum of the currents in the first to third phases and neutral is zero. In practice, as there are often differences between the transfer functions on the live phases and neutral, the sum of the measurements of the currents in the live phases and neutral can be non-zero, and appear imbalanced. To apply the single phase approach to a multi-phase configuration one needs to characterise the imbalance by, for example, determining how the transfer functions of the different phases contribute towards the imbalance. This means one needs to determine the ratio of transfer functions between all of the different pair combinations of live and neutral phases.

The present inventors have appreciated that even if one were to extend the single phase approach described above in this fashion, the approach provides only one independent equation, i.e. (F1*M1)+(F2*M2)+(F3*M3)+(FN*MN)=0. In the single phase example briefly discussed above (and in more detail later on with respect to equations 1 to 14) we needed to compare the relative responses of the transfer functions of the two current sensors, and this was expressed as a transfer function ratio K. Extending this principle, in a multiphase system one needs to compare the relative responses of a plurality of current sensors and this can be expressed as a plurality of transfer function ratios. However it can be seen that creating only a single independent equation, as set out above, is insufficient to allow the plurality of transfer function ratios to be correctly identified. More independent equations are required to provide the various transfer function ratios. The number of independent equations required depends on the form of the multi-phase configuration. For example two independent equations are required where one applies the single phase approach to a three phase arrangement without neutral or to a split phase arrangement, i.e. two live phases and neutral. According to this example and where there are first and second phases and neutral, a first ratio, K1, and a second ratio, K2, are required with K1 being the ratio of the transfer function, F1, of the current sensor in the first phase and the transfer function, FN, of the neutral current sensor and K2 being the ratio of the transfer function, F2, of the current sensor in the second phase and the transfer function, FN, of the neutral current sensor. By way of another example three independent equations are required where one extends the single phase approach to a three phase arrangement with neutral. According to this example, first to third ratios, K1 to K3, are required with each of K1 to K3 being a ratio of a different one of the current sensors in the first to third phases and the transfer function, FN, of the neutral current sensor.

The present subject matter has been devised in the light of the above described problems. It is therefore an object for the present disclosure to provide current measurement apparatus which is configured to measure current in conductors of a multi-phase electricity supply in which the sum of the measurements of the currents (as distinct from the actual currents under no ground fault conditions) in the conductors of the multi-phase electricity supply is other than substantially zero This summing of the measurements to a non-zero value results from a difference between transfer functions of the measurement apparatus on the conductors under measurement.

The current measurement apparatus is configured to estimate the amount of mismatch between the transfer functions and to compensate for the mismatch. It is also an object to avoid having to use two measurement transducers per phase of the supply, although such an option is not excluded if we wish to allow checking between the phases to improve signal extraction or wish to add redundancy to the system.

Preferably the current measurement apparatus comprises:
a measurement arrangement configured to be disposed in relation to at least one load which draws a current signal from a multi-phase electricity supply, the measurement arrangement being operative when so disposed to measure the load drawn current signal in each of at least three conductors of the multi-phase electricity supply and provide respective output signals;
a signal source operative to apply a reference input signal to the measurement arrangement whereby the output signal measured in respect of a conductor comprises a load output signal corresponding to the load drawn current signal in the conductor and a reference output signal corresponding to the reference input signal; and
processing apparatus which is operative to determine at least first and second transfer function ratios, the first transfer function ratio being determined in respect of a first pair of conductors and the second transfer function ratio being determined in respect of a second pair of conductors, the at least first and second transfer function ratios being determined based on at least a part of each of the output signals measured in respect of the at least three conductors, each transfer function ratio being determined differently from the at least one other transfer function ratio in respect of real and imaginary parts or magnitude and phase at one of: a) at least one frequency band and b) at least time window of the output signals.

Preferably the processing apparatus is further operative to make a determination in respect of at least one of: a measured load drawn current signal; and electrical power consumed by the at least one load, the determination being made in dependence on the at least first and second transfer function ratios, the reference input signal and at least a part of output signals measured in respect of the conductors and comprising reference output signals.

The reference signal is preferably a known time varying current.

By estimating the transfer ratios it becomes possible to estimate the load current in the channel where the reference input signal is applied with greater accuracy. The estimate of the load current can then be extracted/subtracted from the output signal of that channel to leave the reference output signal. The reference output signal can be regarded as being subject to reduced interference resulting from the load current. With less interference being associated with the reference output signal it becomes possible to estimate the transfer function of measurement arrangement with greater certainty.

The measurement arrangement is operative, in use, to measure the load drawn current signal in each of at least three conductors of the multi-phase electricity supply and provide a respective output signal. A signal source of the current measurement apparatus is arranged to apply a reference input signal to the measurement arrangement whereby the output signal measured in respect of a conductor comprises a load output signal corresponding to the load drawn current signal in the conductor and a reference output signal corresponding to the reference input signal.

The processing apparatus of the current measurement apparatus is operative to determine at least first and second transfer function ratios. The first transfer function ratio is determined in respect of a first pair of conductors and the second transfer function ratio is determined in respect of a second pair of conductors. The at least first and second transfer function ratios are determined in dependence on at least a part of each of the output signals measured in respect of the at least three conductors. Preferably at least one of the output signals lacks a reference output signal.

The measurement apparatus may be configured and operative such that transfer function ratios are determined using measurements made in respect of all conductors comprised in the multi-phase electricity supply. For example and where the multi-phase electricity supply is a split-phase supply comprising first and second live phases and neutral, a first transfer function ratio may be determined in respect of the first live conductor and neutral and a second transfer function ratio may be determined in respect of the second live conductor and neutral. Alternatively the first transfer function ratio may be determined in respect of the first live conductor and neutral and the second transfer function ratio may be determined in respect of the first live conductor and the second live conductor. Irrespective of which transfer function ratios are deter mined the ratios may be determined in dependence (as a function of) on measurements made in respect of all three conductors, i.e. measurements made in respect of the first and second live conductors and the neutral conductor.

By way of another example and where the multi-phase electricity supply is a three-phase supply comprising first to third live phases and neutral, a first transfer function ratio may be determined in respect of the first live conductor and neutral, a second transfer function ratio may be determined in respect of the second live conductor and neutral and a third transfer function ratio may be determined in respect of the third live conductor and neutral or in respect of the first live conductor and the third live conductor.

In another embodiment and where the multi-phase electricity supply is a three-phase supply comprising first to third live phases and neutral, the current in one of the conductors may be assumed to have a particular value whereby the transfer function ratios may be determined on the basis of measurements made in respect of only three of the four conductors. For example the neutral conductor may be assumed to have a value of zero. The present embodiment may be appropriate where, for example, there is no current measurement in respect of neutral.

The processing apparatus may be operative to determine the transfer function ratios in dependence on application of a linear function, such as a Fast Fourier Transform (FFT) or an integral, as described in more detail below. The application of a non-linear function, such as Root Mean Square (RMS), may be less desirable on account of there being more than one current path in a multi-phase arrangement.

Advantageously the processing apparatus is further operative such that each transfer function ratio is determined differently from the at least one other transfer function ratio in respect of at least one of real and imaginary parts in at least one frequency band and/or at least one time window of the output signals. The real and imaginary parts may be examined by reference to a signal magnitude and phase. The processing apparatus may thus be operative on the basis of at least two independent equations (obtained by virtue of different determination in respect of at least one of real and imaginary parts in at least one frequency band and time window of the output signals) to provide at least two corresponding transfer function ratios. Where the multi-phase electricity supply comprises three conductors, such as two live conductors and neutral or three live conductors, the processing apparatus may be operative to provide two transfer function ratios and where the multi-phase electricity supply comprises four conductors, such as three live conductors and neutral, the processing apparatus may be operative to provide three transfer function ratios.

Preferably the processing apparatus is yet further operative to make a determination in respect of at least one of: a) a measured load drawn current signal; and b) electrical power consumed by the at least one load. The determination is made in dependence on the at least first and second transfer function ratios, the reference input signal and at least a part of output signals measured in respect of the conductors lacking a reference output signal. With regards to the making of a determination in respect of at least one of a measured load drawn current signal and electrical power consumed by the at least one load, the processing apparatus may be operative to determine one or more conditions, such as power consumption, a fault condition or to detect tampering of an electricity consumption meter as described further below and in WO 2013/038176. The determination may be made on a periodic basis.

As specified above each transfer function ratio is determined in dependence on at least a part of output signals measured in respect of conductors and which each lack a reference output signal.

According to a first approach no reference input signal may be applied to the conductors when a transfer function ratio is determined whereby the output signals measured in respect of the conductors lack reference output signals.

According to a second approach a reference input signal is applied to a conductor and the processing apparatus may be operative on a part of each of the output signals measured in respect of the conductors that lacks a reference output signal. The signal source may be operative to apply a reference input signal having a different characteristic to the load drawn current signal whereby a part of the output signals lacks a reference output signal. For example the reference input signal may have a different frequency profile to the load drawn current signal whereby frequency analysis by the processing apparatus provides for extraction of the part lacking the reference output signal from the rest of the output signal.

According to a third optional approach the current measurement apparatus may be operative to at least reduce if not remove the reference output signal from the output signals. More specifically the current measurement apparatus may comprise a filter which is operative to reduce if not remove the reference output signal from the output signals. Alternatively or in addition the current measurement apparatus may be operative to apply a reference removing transfer function to reduce if not remove the reference output signal from the output signal. Characteristics of the reference removing transfer function may be determined in dependence on knowledge of characteristics of the reference input signal. For example the contribution of the reference input signal to the measured output signal may be estimated. The processing apparatus may then be operative to remove the reference output signal from the measured output signal in dependence on the estimated contribution. However if the reference signal is significantly smaller that the load signal or is bipolar (i.e. it changes direction such that its long term average contribution to the measured current is zero) then the contribution from the reference signal may not need to be removed. Generally, if the current measurement is used as part of an energy measurement system where the power used (or generated) is calculated as the product of I and V and any phase angle between I and V, then the reference signal may be ignored if it is uncorrelated with I or V since over time its net energy contribution is zero. However if more complex calculations are required then it is possible that the reference signal may influence those calculations and it may be advantageous for the processing apparatus to remove the reference signal.

According to a fourth approach, the current measurement apparatus may be operative on a time domain basis to determine a transfer function ratio in dependence on a part of output signals lacking a reference output signal. For example and where the reference input signal is applied as a square wave the processing apparatus may be operative to apply a window to select a part of an output signal lacking a reference output signal.

The current measurement apparatus may be operative to apply one or more of the first to fourth approaches.

As specified above each transfer function ratio is determined differently from the at least one other transfer function ratio in respect of the real parts, the imaginary parts or both the real and imaginary parts in at least one frequency band and/or time window of the output signals. When one considers the at least a part of the output signals which are to be used for transfer function ratio determination in the frequency domain, the output signals may comprise plural independent data. Such plural independent data may be used to provide plural independent equations. Considering the time domain further, components of the load drawn current signals, which are derived from measurement of the output signals from the at least three conductors, may sum to zero within a frequency band in accordance with Kirchhoff's current law. More specifically each of the real and imaginary parts of the components of the derived load drawn current signals within a frequency band should sum to zero when there are no other current flow paths, such as leakage paths due to ground faults. Treating the real and imaginary parts of the components of the derived load drawn current signals separately can therefore provide two independent equations. For example where the multi-phase electricity supply has three conductors, first and second transfer function ratios may be determined in dependence on the real and imaginary parts of the derived load drawn current signals within a frequency band. The processing apparatus may therefore be operative to determine real and imaginary parts of at least a part of a derived load drawn current signal. More specifically the processing apparatus may be operative to perform a function to perform a spectral analysis, such as a Fast Fourier Transform (FFT), on derived load drawn current signals to provide the real and imaginary parts. For example an FFT may be operative to provide ten bins between 0 and 100 Hz with each bin being 10 Hz wide. The real and imaginary parts of the contents of the 50 Hz bin may then be used to provide two independent equations. The number of frequency bins, their width and spanned frequency range are only given by way of non-limiting example.

Alternatively or in addition plural independent data may be obtained from plural frequency bands of a derived load drawn current signal. More specifically first independent data may be obtained from a first frequency band and second independent data may be obtained from a second frequency band. According to the example provided above in which an FFT is applied to provide ten bins between 0 and 100 Hz, the real parts of the contents of the 50 Hz bin and of the 70 Hz bin may be used to provide two independent equations. Considering the example of the multi-phase electricity supply having three conductors, first and second transfer function ratios may be determined by reference to output signal data in first and second frequency bands. By way of another example and where the multi-phase electricity supply has four conductors, first to third transfer function ratios may be determined in dependence on signal data comprised in first to third frequency bands. Alternatively plural frequency bands and real and imaginary parts may be used in combination whereby in a four conductor multi-phase electricity supply first and second transfer function ratios may be determined in dependence on the real and imaginary parts of signals within a first frequency band and a third transfer function ratio may be determined in dependence on signal data comprised in a second frequency band. The use of tones of a non-harmonic nature may be reflective of uncorrelated data. According to a first approach the processing apparatus may therefore be operative on data comprising tones of a non-harmonic nature. The processing apparatus may be operative to determine whether or not data is sufficiently uncorrelated. More specifically the processing apparatus may be operative to determine ratios of values, such as of real values, for data measured in respect of the conductors and to determine a variation between the determined ratios. In addition the processing apparatus may be operative to compare the variation between the determined ratios with a threshold value and if the variation exceeds the threshold value to conclude that the data is sufficiently uncorrelated. According to a second approach the processing apparatus may be operative on tones of a harmonic nature. More specifically the processing apparatus may be operative to make selective use of tones which comprise independent data in dependence on knowledge of key frequency components of the load drawn current signal. For example odd harmonics may be caused by different loading circumstances than even harmonics and it may be known or determinable that the odd harmonics are more liable to contain independent data than the even harmonics. Therefore and where 50 Hz is the fundamental frequency the processing apparatus may be operative on the third and fifth harmonics, i.e. 150 Hz and 250 Hz. Alternatively the processing apparatus may be operable to process a combination of odd and even harmonics, e.g. 150 Hz and 200 Hz where the fundamental frequency of the supply is 50 Hz.

Alternatively or in addition plural independent data may be obtained from plural different time windows of an output signal. Different loads, e.g. with regards to load switching or non-linearity, may be present at different times. Therefore the output signal may be analysed at different time windows to provide independent equations. According to one approach the windows may span plural cycles of the load drawn current signal. A loading circumstance may change on a comparatively long term basis and such that the change is evident from one cycle to another of the load drawn current signal. For example an appliance may switch on or off and may thereby provide for independent data in the form of data measured before and after switching. According to another approach the windows may be within a cycle of the load drawn current signal. A loading circumstance may change on a comparatively short term basis and such that the change is evident within one cycle of the load drawn current signal. For example a half-wave rectifier is operative to turn on near positive or negative peaks, a full-wave rectifier is operative to turn on near both positive and negative peaks, a thyristor based dimmer turns on at any point in the cycle but always turns off at around the zero-crossing point and linear loads draw current proportional to the load on the line. Knowledge of the loading circumstances or determination of the loading circumstances, for example, by way of analysis of the load drawn current signal may provide for determination as to a length of windows relative to the period of the load drawn current signal and the relative phase of the windows and the load drawn current signal. According to yet another approach each window may be of a length such that it spans a sample of load drawn current signal. The voltage and the current may change from one sample to the next in a different direction in respect of each phase of a multi-phase arrangement. The ratio of loads and hence transfer functions may therefore change from sample to sample on account of current in each load changing by a different proportion.

At least one transfer function ratio may be determined on an on-going basis, for example by forming a moving average or using values from a moving time window. There may therefore be no need to update all the values used to determine the transfer function ratio with only those values provided by present measurements being updated. Where transfer function ratio determination is on the basis of values which are not updated in dependence on measurements, such values may be previously measured values or estimated values. In addition a determination may be made on an on-going basis in respect of at least one of a measured load drawn current signal and electrical power consumed. The determination may for example comprise determining at least one transfer function.

The processing apparatus may be further operative to determine at least one of a transfer function and a change in transfer function in respect of at least one conductor.

The processing apparatus may be operative to determine a transfer function for at least one of the plural current sensors by analysis of a measured reference output signal. As noted before the transfer function may be determined in dependence on a reference input signal applied to a current sensor and on data corresponding to a reference output signal comprised in an output signal measured by the current sensor. The data corresponding to a reference output signal may be determined in dependence on the at least first and second transfer function ratios and at least a part of output signals measured in respect of the conductors which comprise a reference output signal. Determination of the corresponding data in dependence on the at least first and second transfer function ratios and the measured output signals may include subtraction of the load output signal from the output signals measured in respect of the conductors when the reference input signal is applied. Where the processing apparatus is operative to determine a change in transfer function, the processing apparatus may be further operative to detect if there has been a tampering event or there is a fault. Tamper and fault detection is described further in WO 2013/038176.

Having determined the transfer function ratios the processing apparatus may be operative in dependence on the transfer function ratios to subtract the load output signal from at least a part of an output signal measured in respect of a conductor and which comprises a reference output signal to leave the reference output signal. Subtracting the load output signal in dependence on the transfer function ratios may provide for the load output signal being subtracted to a more proper extent than would be the case of the teachings of the present disclosure were not applied. The processing apparatus is then operative to make the determination in respect of at least one of: a measured load drawn current signal; and electrical power consumed by the at least one load. An improved determination may therefore be made, for example, where the load output signal is of much greater amplitude than the reference output signal that a determination which depends on the reference output signal may otherwise be difficult to make.

The present inventors have appreciated that a change in a ratio of transfer functions may be indicative of a tamper or fault event and thus it may be unnecessary to determine a change in the transfer function. According to another approach the processing apparatus may therefore be operative to detect a change over time in a transfer function ratio and to make a determination with regards to a tamper or fault event in dependence on the change in the transfer function ratio. More specifically the change in the transfer function ratio may be compared with a specified value and if the change is greater than the specified value a tamper or fault event may be indicated.

The current measurement apparatus may be configured to apply plural reference input signals, each reference input signal being applied to the measurement arrangement in respect of a different conductor. The plural reference input signals may have substantially the same characteristics and may be applied to the measurement arrangement at different times. Alternatively the plural reference input signals may have different characteristics and may be applied to the measurement arrangement at the same time or at different times or some signals may be arranged to overlap (wholly or partially) in the time domain whilst others do not.

The present inventors have appreciated that it may be unnecessary to apply more than one reference input signal to the measurement arrangement to enable a determination to be made in respect of at least one of measured load drawn current signal and electrical power consumed by the at least one load. Accordingly the processing apparatus may be operative to determine a transfer function in respect of a first one of the conductors in dependence on the transfer function ratios and measurement in respect of the conductor when a reference input signal is applied to the first one of the conductors. In addition the processing apparatus may be operative to determine the transfer function in respect of each of the other conductors in dependence on the transfer function determined for the first one of the conductors and the transfer function ratios and without application of a reference input signal to any of the other conductors.

The current measurement apparatus may further comprise at least one filter which is operative to provide for filtering of at least one of: measurements used to determine a transfer function ratio; a transfer function ratio; and a determination such as of a transfer function made in dependence on a transfer function ratio. The at least one filter may be constituted as a digital filter and may therefore be comprised in the processing apparatus. The filter may be configured to perform at least one of open loop filtering and closed loop filtering. An open loop filter may involve a single pass and no feedback, such as a rolling average or a windowed average. A closed loop filter may be configured to feedback data from the output from the filter to the input to the filter whereby the closed loop filter is operative to track or follow a change. The closed loop filter may, for example, be a best fit filter. Where a best fit approach is employed initial values may be at least one of determined on the basis of earlier measurements and estimated. Subsequent values may be determined in dependence on measurements and in accordance with a given approach such as a hill climb approach or application of a least mean squares filter. Subsequent values may be tested with regards to their error, for example as described below, and further values determined in dependence thereon to, for example, reduce the error.

The processing apparatus may be operative to determine a measure of confidence with regards to determination of a transfer function ratio. More specifically the processing apparatus may be operative to determine a measure of confidence in dependence on at least one error determined in dependence on the transfer function ratios. The error may be determined as a function of the sum of the currents measured in respect of the all the conductors. In an ideal arrangement the sum of the measured currents in all the conductors is zero. Where the sum of the currents measured in respect of the all the conductors is a value other than zero the magnitude of the value may be reflective of the extent of error. The processing apparatus may be operative to make a decision in dependence on the error as to whether or not to use the approach according to the present subject matter. More specifically and where the determined error is greater than a specified value the processing apparatus may be operative to use the approach according to the present subject matter. Alternatively and where the determined error is greater than the specified value, the processing apparatus may be operative to use an alternative approach to making a determination such as one of the other approaches described in WO 2013/038176.

The measurement arrangement may comprise plural current sensors with each current sensor being disposed relative a different conductor to thereby measure the load drawn current in the conductor. A current sensor may be a shunt resistor, a current transformer, a Hall current probe or a Rogowski coil like current probe. The measurement arrangement may comprise plural current sensors of the same type, e.g. shunt resistor, or plural current sensors of different types, e.g. a shunt resistor in each of plural live conductors and a current transformer disposed around the neutral conductor.

Where the load drawn current signal is an alternating current, the fundamental frequency of the alternating current may be less than 500 Hz, such as a frequency of substantially 60 Hz or substantially 50 Hz for domestic mains or a frequency of substantially 400 Hz for mains in ships or aircraft. Alternatively or in addition a frequency of a reference input signal may be less than 250 kHz, 100 kHz, 50 kHz, 20 kHz, 10 kHz, 5 kHz, 2.5 kHz or 1.25 kHz, 625 Hz, 320 Hz, 160 Hz, 80 Hz or less than the fundamental of the load drawn current.

An amplitude of a reference input signal may be much smaller than an amplitude of the load drawn current. The load drawn current signal may be at least 0.1 Amp peak or RMS. More specifically the load drawn current signal may be at least 1 Amp peak or RMS, 5 Amps peak or RMS, 10 Amps peak or RMS, 20 Amps peak or RMS, 40 Amps peak or RMS, 80 Amps peak or RMS, 100 Amps peak or RMS, 200 Amps peak or RMS or 320 Amps peak or RMS. In contrast the reference input signal may be between 100 µA and 500 mA. These values are for guidance only.

In an embodiment of the present disclosure there is provided current measurement apparatus comprising:

a measurement arrangement configured to be disposed in relation to at least one load which draws a current signal from a multi-phase electricity supply, the measurement arrangement being operative when so disposed to measure the load drawn current signal in each of at least three conductors of the multi-phase electricity supply and provide a respective output signal;

a signal source operative to apply a reference input signal to the measurement arrangement whereby the output signal measured in respect of a conductor comprises a load output signal corresponding to the load drawn current signal in the conductor and a reference output signal corresponding to the reference input signal; and processing apparatus which is operative to determine at least first and second transfer function ratios, the first transfer function ratio being determined in respect of a first pair of conductors and the second transfer function ratio being determined in respect of a second pair of conductors, the at least first and second transfer function ratios being determined in dependence on at least a part of each of the output signals measured in respect of the at least three conductors and which lacks a reference output signal, each transfer function ratio being determined differently from the at least one other transfer function ratio in respect of real and imaginary parts or of magnitude and phase at one of: a) at least one frequency band and b) at least time window of the output signals;

the processing apparatus being further operative to make a determination in respect of at least one of: a measured load drawn current signal; and electrical power consumed by the at least one load, the determination being made in dependence on the at least first and second transfer function ratios, the reference input signal and at least a part of output signals measured in respect of the conductors and comprising reference output signals.

According to a second aspect of the present disclosure there is provided a multi-phase electricity supply arrangement comprising: at least one load; at least three conductors from which a current signal is drawn by the at least one load; and current measurement apparatus according to the first aspect of the present disclosure.

The multi-phase mains electricity supply may be a split-phase supply or a three phase supply without neutral. The multi-phase electricity supply arrangement may therefore comprise three conductors, such as two live conductors and a neutral conductor or three live conductors. The current measurement apparatus may be configured to make a corresponding number of measurements. Alternatively the multi-phase mains electricity supply may be a three phase supply with neutral. The multi-phase electricity supply arrangement may therefore comprise four conductors, such as three live conductors and a neutral conductor. The current measurement apparatus may be configured to make a corresponding number of measurements. Alternatively a working assumption may be made that the current in the neutral conductor is small and the current sensor in the neutral line may be omitted or an assumed transfer function may be used. This gives rise to a reduction in the accuracy with which the transfer functions are estimated, but this may be an acceptable trade-off to simplify the signal processing and computational burden whilst also potentially reducing the component count. Further embodiments of the second aspect of this disclosure may comprise one or more features of the first aspect of this disclosure.

It is a further object for the present disclosure to provide a current measurement method which provides for measurement of current in conductors of a multi-phase electricity supply in which differences in the transfer functions of the current measurement components causes the sum of the measurements of the currents in the conductors of the multi-phase electricity supply to be other than substantially zero.

According to a third aspect of the present disclosure there is provided a current measurement method comprising:

measuring by way of a measurement arrangement a load drawn current signal in each of at least three conductors of a multi-phase electricity supply to provide a respective output signal;

applying a reference input signal to the measurement arrangement whereby the output signal measured in respect of a conductor comprises a load output signal corresponding to the load drawn current signal in the conductor and a reference output signal corresponding to the reference input signal;

determining at least first and second transfer function ratios, the first transfer function ratio being determined in respect of a first pair of conductors and the second transfer function ratio being determined in respect of a second pair of conductors, the at least first and second transfer function ratios being determined in dependence on at least a part of each output signal measured in respect of the at least three conductors and which lacks a reference output signal, each transfer function ratio being determined differently from the at least one other transfer function ratio in respect of at least one of real and imaginary parts in at least one frequency band and time window of the output signals; and making a determination in respect of at least one of: a measured load drawn current signal; and electrical power consumed by the at least one load, the determination being made in dependence on the at least first and second transfer function ratios, the reference input signal and at least a part of output signals measured in respect of the conductors and comprising reference output signals.

Embodiments of the third aspect of the present disclosure may comprise one or more features of the first aspect of the present disclosure.

BRIEF DESCRIPTION OF DRAWINGS

Further features and advantages of the present subject matter will become apparent from the following specific description, which is given by way of example only and with reference to the accompanying drawings, in which:

FIG. 1 shows a three-phase star configuration with neutral;

FIG. 2 shows a three-phase delta configuration;

FIG. 3 shows live and neutral current waveforms a three-phase configuration;

FIG. 4 shows the sum of the measured live and neutral waveforms in a three-phase configuration where the transfer functions in current measurement channels are not accurately matched;

FIG. 9 shows an equation used in determining transfer function ratios;

DESCRIPTION OF SOME EMBODIMENTS OF THIS DISCLOSURE

Figure 13:
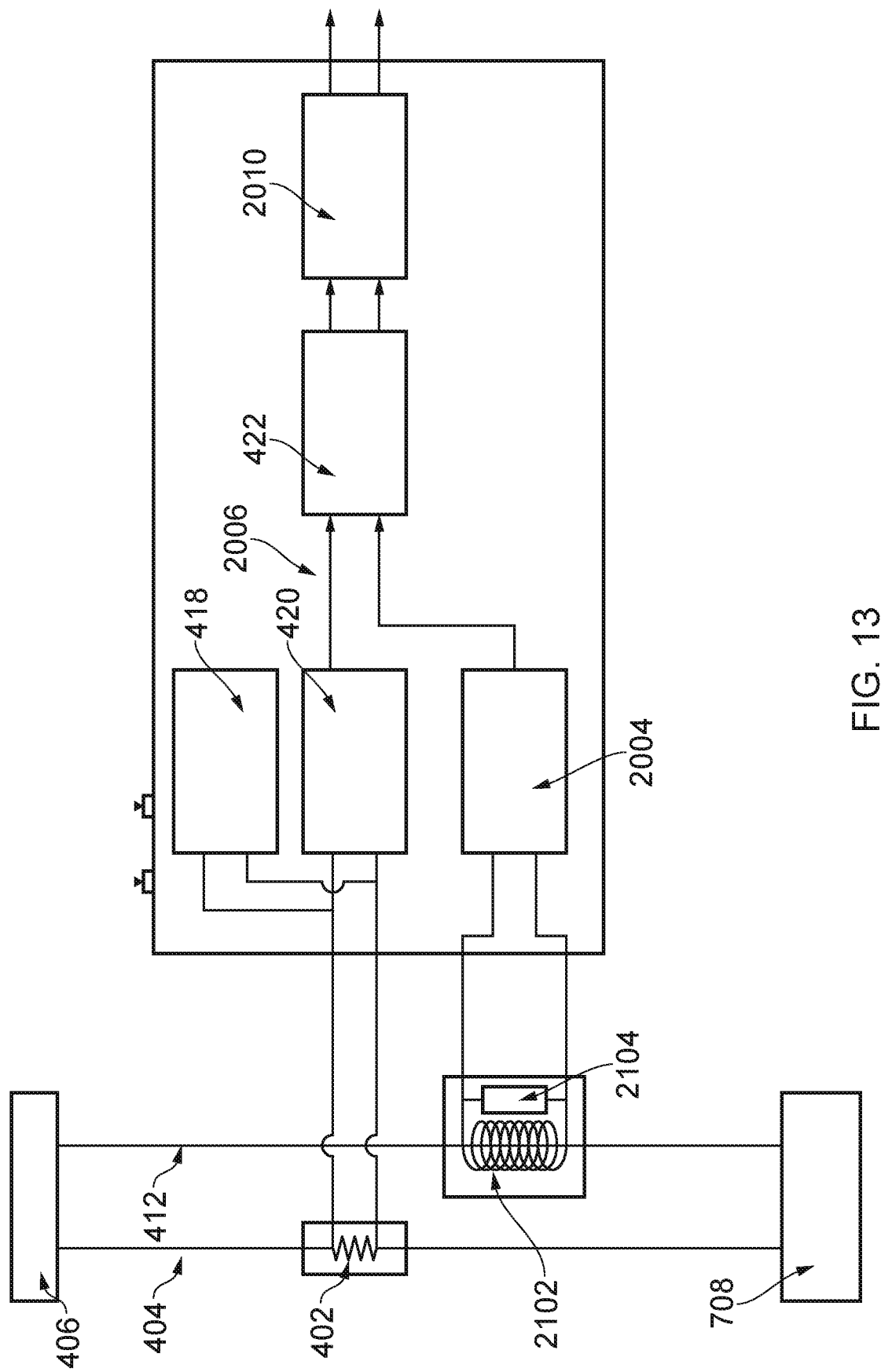
FIG. 13 reproduces a diagram from WO 2013/038176.

In general, it is desirable to know the current flowing through a wire. An apparatus which can do this is described in WO 2013/038176. FIG. 13 reproduces part of FIG. 17b of WO 2013/038176 which will be discussed in order to provide a useful tutorial. In the inventive arrangement described in WO 2013/038176 a signal source 418 generates a reference current r(t) that is known to a desired accuracy. The signal source 418 is connected to both ends of a first current transducer, in this example, a current shunt 402 in a supply line 404 between a power supply 406 and a load 708. A return line is provided by conductor 412.

If the load current at time t in line 404 is I(t) then the current $I_{402}(t)$ through the current shunt 402 is $$I_{402} + I(t) + r(t) \qquad \text{Eqn. 1}$$

The shunt has resistance $R_{402}$, and a voltage $V_{402}$ is developed across the shunt 402. This voltage is measured by signal processing and conversion block 420.

A second current transducer 2102, which in this example is a current transformer, is provided in series with the first current shunt 402 by virtue of being in conductor 412. The current $I_{2102}$ flowing in the second current transducer is I(t) as it is the load current. This gives rise to a voltage $V_{2102}$ being developed across a burden resistor 2014 of the second current transducer.

It can be seen that it should be possible to take the voltage $V_{2102}$ and scale and invert it such that it matches and cancels a voltage component across the current shunt 402 which voltage component is due solely to the load current I(t).

If this is done successfully, then we can extract a voltage component developed across the current shunt 402 due solely to the reference current r(t).

Given that r(t) is known, this allows the transfer function of the current shunt 402 and the signal processing and conversion block to be estimated with improved accuracy. The transfer function is extracted in block 422 and further processing is performed in block 2010.

If we adopt a convention where current flow towards the load is positive then $$I_1 + I_n = 0 \qquad \text{Eqn. 2}$$

where $I_1$ is the current in conductor 404
$I_n$ is the current in conductor 412

The signal processing block 420 and 2004 can be regarded as outputting digital codes $C_1$ and $C_n$ respectively. We can write $$I_1 = F_1 C_1 \qquad \text{Eqn. 3}$$

$$I_n = F_n C_n \qquad \text{Eqn. 4}$$

From here we can derive a ratio of the transfer function since $$F_1 C_1 + F_n C_n = 0 \qquad \text{Eqn. 5}$$

$$\therefore \frac{F_1}{F_n} = \frac{-C_n}{C_1} = K \qquad \text{Eqn. 6}$$

knowing the ratio K we can now use this to scale $C_n$ to subtract it from $C_1$ to leave the contribution from the reference current.

We know (from FIG. 13)

$$I_1 + I_r = F_1 C_1 \qquad \text{Eqn. 7}$$

also $$I_1 = -I_n = -F_n C_n \qquad \text{Eqn. 8}$$

From Equation 8, it is useful to rewrite $F_n$ in terms of the transfer function ration K.

From Equation 6, we can multiply both sides by $F_n$ and then divide by K such that $$\frac{F_1}{K} = F_n \qquad \text{Eqn. 9}$$

Substituting into Equation 8

$$I_1 = -\frac{F_1 C_n}{K} \qquad \text{Eqn. 10}$$

We can then substitute this expression for $I_1$ back into Equation 7

$$F_1 C_1 = I_r - \frac{F_1 C_n}{K} \qquad \text{Eqn. 11}$$

So dividing by $C_1$ $$F_1 = \frac{I_r}{C_1} - \frac{F_1 C_n}{C_1 K} \qquad \text{Eqn. 12}$$

and collecting terms in $F_1$ on one side of the equation $$F_1 \left(1 + \frac{C_n}{C_1 K}\right) = \frac{I_r}{C_1} \qquad \text{Eqn. 13}$$

or

-continued $$F_1 = \frac{I_r K}{C_1 K + C_n}$$ Eqn. 14

Thus, from obtaining the code ratio in the absence of the reference signal, and knowing the magnitude of the reference signal $I_r$, it becomes possible to determine the value of $F_1$.

It can be seen that the technique described above reduces the interference of the load current on the extraction of the reference signal and calculation of the transfer function uses two sensors on a single phase.

Extending this to multi-phase systems having three or four conductors might therefore require six or eight current transducers and associated signal processing electronics. This incurs costs which adversely effects customer uptake of such products. The inventors wish to extend the technique desired in WO 2013/038176 to multiphase systems but without committing to large numbers of current transducers.

A three-phase star configuration with neutral, generally designated 10 is shown in FIG. 1. The configuration 10 comprises a first load 12 in a first live phase L1 which carries a current I1, a second load 14 in a second live phase L2 which carries a current I2 and a third load 16 in a third live phase L3 which carries a current I3. The neutral phase carries a current In. According to Kirchhoff's current law the sum of the currents at node 17 is zero such that I1+I2+I3+In=0. Kirchhoff's current law also applies to a three-phase star configuration without neutral such that I1+I2+I3=0.

A three-phase delta configuration, generally designated 20, is shown in FIG. 2. The configuration 20 comprises a first live phase L1 with current I1, a second live phase L2 with current I2 and a third live phase L3 with current I3. It also comprises a load 22 between the first and third live phases, a load 24 between the first and second live phases and a load 26 between the second and third live phases. Kirchhoff's current law applies here such that I1+I2+I3=0.

Live and neutral current waveforms in a three-phase configuration are shown in FIG. 3. As can be seen from FIG. 3 the phase and relative magnitudes of the live and neutral current waveforms are such that their sum is zero (assuming no ground fault). In practice, however, there is invariably a difference between the transfer functions of the transducers and associated measurement circuits on the live phases and neutral whereby the sum of the measurements of the currents in the live phases and neutral is non-zero and thus appears imbalanced even though the currents are actually balanced. This imbalance is reflected in the sum of waveforms 40 shown in FIG. 4 having a sine wave component.

As described above the present disclosure has been devised on the basis of the realisations that proper subtraction of the load output signal to leave the reference output signal in a three-phase configuration requires determination of ratios of the transfer functions of all the phases and also the provision of a sufficient number of independent equations based on current measurements made in respect of the phases. These realisations are considered further below with reference to FIGS. 5 and 6.

Figure 5:
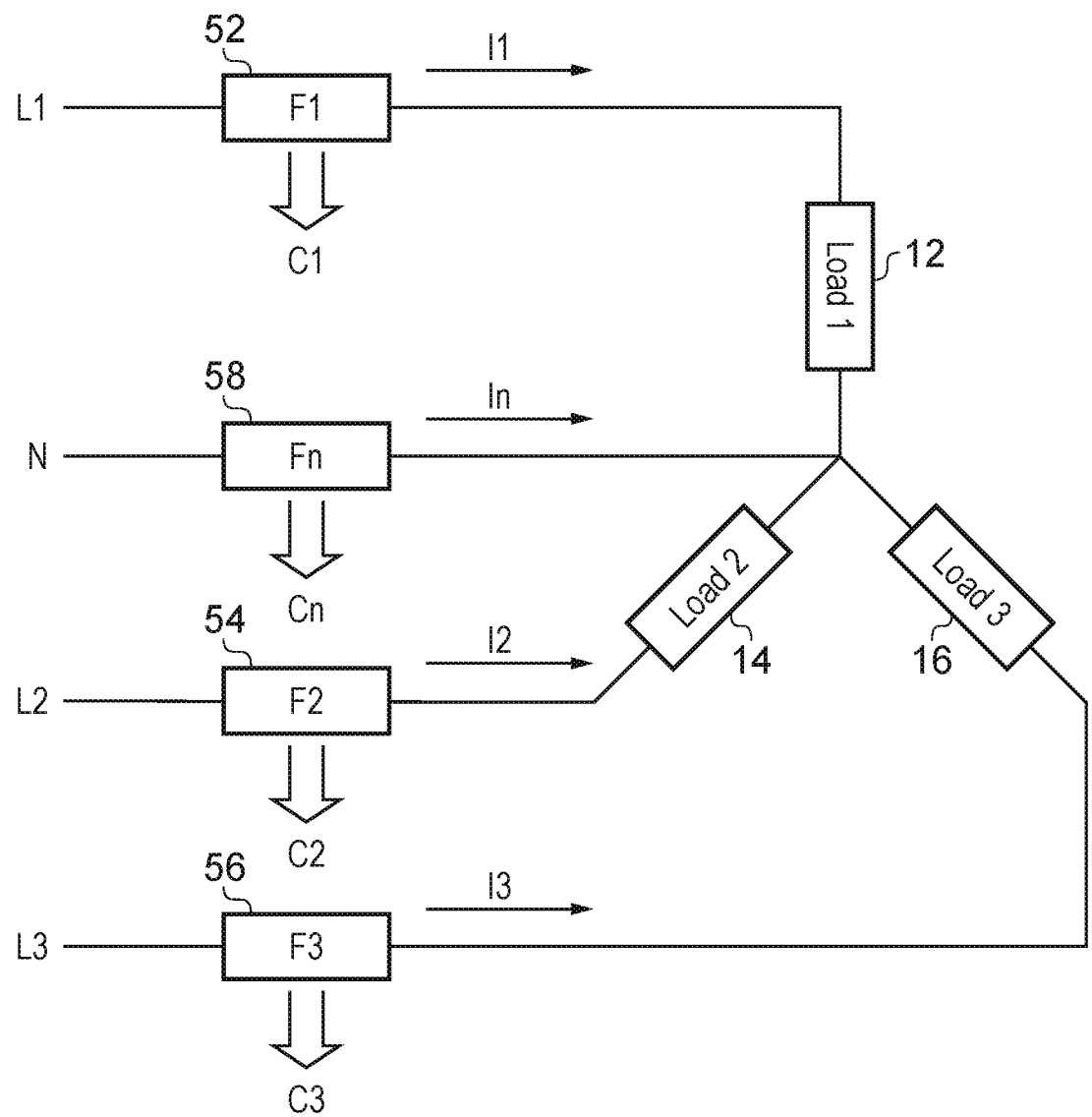
FIG. 5 shows a three-phase star configuration with neutral with four current sensors of a current measurement arrangement.

A three-phase star configuration with neutral with four current sensors of a current measurement arrangement 50 is shown in FIG. 5. The loads LOAD1, LOAD2, and LOAD3 of FIG. 5, are designated by the same reference numerals as in FIG. 1. A first current sensor 52 is disposed so as to measure the load drawn current I1 flowing in a first live phase L1. The first current sensor 52 may comprise a current shunt, an amplifier to amplify the voltage developed across the shunt, a filter, possibly an offset generator to move the common mode value of the voltage developed across the shunt to a range compared to the power supply rails of the amplifier where the input signal is easier to work with, and an analog to digital converter.

As a whole, the current sensor 52 acts to monitor the current I1 and to output a digital code C1 However, since we want to know what to do with the digital code to obtain the current we can represent the conversion from code to current by:

$$I1 = F1 \times C1$$ Eqn. 15

This is the same as Equation 3.

A second current sensor 54 is disposed so as to measure the load drawn current I2 flowing in a second live phase L2. The second current sensor 54 has a transfer function F2 and is operative to provide a second output signal C2 corresponding to the load drawn current signal in the second live phase. A third current sensor 56 is disposed so as to measure the load drawn current I3 flowing in a third live phase L3. The third current sensor 56 has a transfer function F3 and is operative to provide a third output signal C3 corresponding to the load drawn current signal in the third live phase. A fourth current sensor 58 is disposed so as to measure the load drawn current in flowing in the neutral phase. The fourth current sensor 58 has a transfer function Fn and is operative to provide a fourth output signal Cn corresponding to the load drawn current signal in the neutral phase.

Thus we can also write $$I2 = F2 \times C2$$

$$I3 = F3 \times C3$$

$$In = Fn \times Cn$$ Eqn. 16

The present inventors have appreciated that application of Kirchhoff's current law on the basis of the first to fourth load drawn currents I1, I2, I3 and In provides only one independent equation which is insufficient to determine the ratio of transfer functions between different pairs of conductors. As described above two independent equations are required in a three conductor configuration such as a split phase configuration, a three phase delta configuration or a three phase star configuration without neutral. Furthermore three independent equations are required in a four conductor configuration such as a three phase star configuration with neutral.

Plural independent equations are provided by one or more of the approaches which will now be described. It is to be noted that the plural independent equations are provided on the basis of measurement data which lacks a reference output signal. Providing measurement data which lacks a reference output signal is described below.

Figure 6:
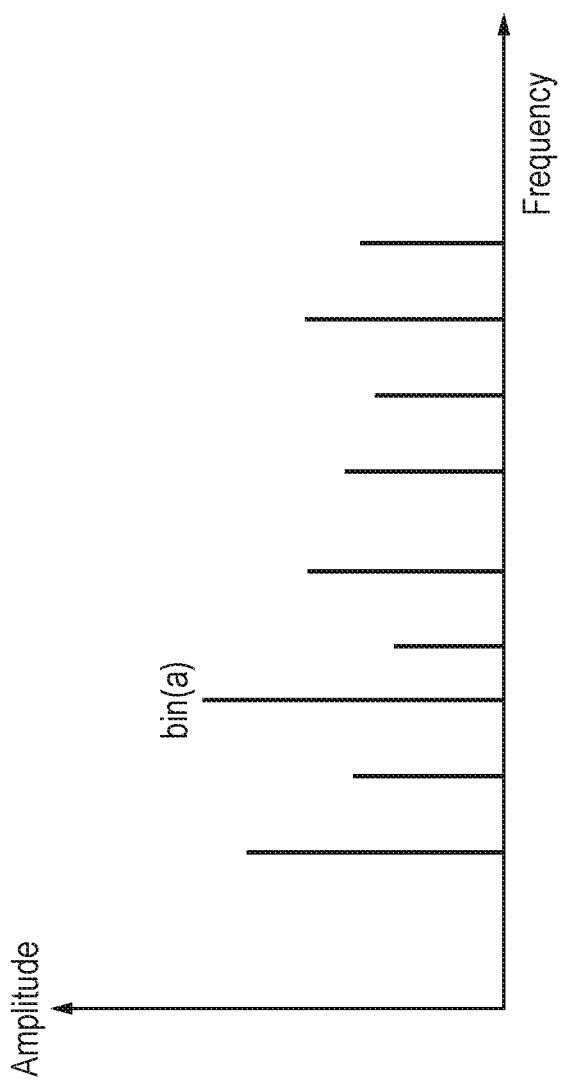
FIG. 6 shows representative bins in a plot of amplitude against frequency.

According to one approach, processing of measurements made with the current sensors in the frequency domain provides an increase in independent measurement data to thereby provide for plural independent equations. According to this approach a Fast Fourier Transform (FFT) is applied to the signals C1, C2, C3 and Cn which are representative of the first to fourth load drawn currents I1, I2, I3 and In, and the transfer functions F1, F2, F3 and Fn. The FFT is arranged to map the components of the signals into discrete frequency ranges, referred to as "bins". In this example the FFT forms ten bins between 0 and 100 Hz with each bin being 10 Hz wide. FIG. 6 shows representative bins in a plot of amplitude against arbitrary frequency. The present inventors have appreciated that Kirchhoff's current law applies to each of the real and imaginary parts of the measured data such that the sum of the real parts is zero and the sum of the imaginary parts is zero.

Figure 7:
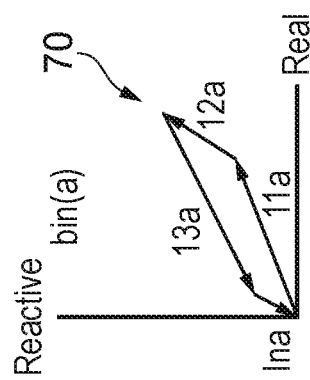
FIG. 7 is a polar plot of current vectors.
Figure 8:
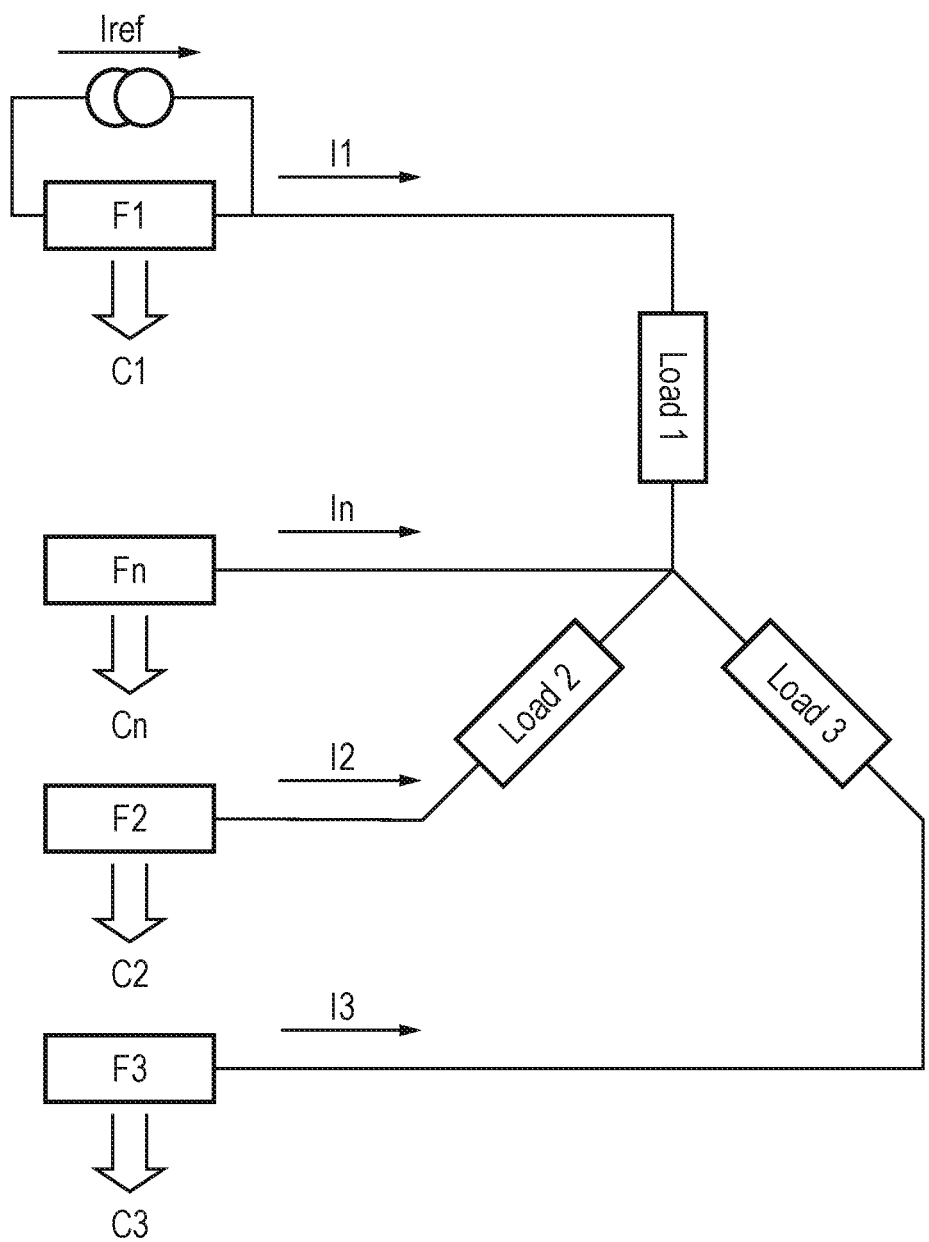
FIG. 8 shows the arrangement of FIG. 5 while a known measurement current is being applied to the first current transducer.

FIG. 7 is a plot of vectors representing the real parts i.e. I1a, I2a, I3a and Ina, where I1a represents real part data in frequency bin (a) identified in FIG. 6 of the current measured in the first live phase, where I2a represents real part data in frequency bin (a) of the current measured in the second live phase, etc.) of the first to fourth load drawn currents I1, I2, I3 and In. In order to comply with Kirchoff's current law the vector plot 70 has to be a closed path that is a path which starts and ends at the origin. Thus Real($I1a+I2a+I3a+Ina$)=0 and

Reactive($I1a+I2a+I3a+Ina$)=0  Eqn. 17

The same applies for other bins. The real parts of, for example, the contents of the 30 Hz bin, the 50 Hz bin and the 70 Hz bin can therefore be used to provide three independent equations. Alternatively the real and imaginary parts in a particular bin can be used to provide two independent equations. By way of another alternative the real and imaginary parts in plural bins can be used to, for example, provide three independent equations by using the real and imaginary parts in the 30 Hz bin and the real parts in the 50 Hz bin.

According to another approach processing of measurements made with the current sensors in the time domain provides an increase in independent measurement data and thereby provides for plural independent equations. According to this approach, the independent data is obtained by applying plural different time windows to the measured output signals. The approach depends on the loading of the multi-phase arrangement changing, for example in respect of a switching event or a non-linearity, over time. A change may take place from cycle to cycle of the load drawn current signal or within a cycle of the load drawn current signal. Where the change takes place from cycle to cycle, for example when an appliance is switched on or off, the time windows span cycles of the load drawn current signal. Where the change takes place within a cycle the windows are within a cycle of the load drawn current signal. A half-wave rectifier, for example, is operative to turn on near positive or negative peaks, a full-wave rectifier is operative to turn on near both positive and negative peaks, a thyristor based dimmer turns on at any point in the cycle but always turns off at around the zero-crossing point and linear loads draw current proportional to the load on the line. The lengths of the windows relative to the period of the load drawn current signal and the relative phase of the windows and the load drawn current signal is determined in dependence on knowledge of the loading circumstances or determination of the loading circumstances by way of analysis of the load drawn current signal from previous measurements. According to a form of this approach each window is of a length such that it spans a sample of load drawn current signal. In this form the voltage and the current change from one sample to the next in a different direction (i.e. an increase or a decrease in magnitude) in respect of each phase of the multi-phase arrangement. The ratio of loads and hence transfer function ratios therefore change from sample to sample on account of current in each load changing by a different proportion.

A worked example in which three transfer function ratios for the configuration shown in FIG. 5 will now be provided.

In this example, suffix 'a' denotes for example, real parts from the 30 Hz bin, $F_x$ denotes the transfer function of the Xth current measurement arrangement and $C_{xa}$ represents the code of the Xth current measurement arrangement, where X=1 to 3 for the first to third phases or n for neutral:

$$F_1 C_{1a} + F_2 C_{2a} + F_3 C_{3a} + F_n C_{na} = 0 \qquad \text{Eqn. 18}$$

$$\Rightarrow F_1 = \frac{F_2 C_a + F_3 C_{3a} + F_n C_{na}}{-C_{1a}} \qquad \text{Eqn. 19}$$

Then using a second set of samples in which suffix 'b' denotes, for example, imaginary parts from the 30 Hz bin, and substituting $F_1$ from the equation above:

$$F_1 C_{1b} + F_2 C_{2b} + F_3 C_{3b} + F_n C_{nb} = 0 \qquad \text{Eqn. 20}$$

$$\Rightarrow F_2 = \frac{F_1 C_{1b} + F_3 C_{3b} + F_n C_{nb}}{-C_{2b}} \qquad \text{Eqn. 21}$$

$$\Rightarrow F_2 = \frac{\frac{F_2 C_{2a} + F_3 C_{3a} + F_n C_{na}}{-C_{1a}} C_{1b} + F_3 C_{3b} + F_n C_{nb}}{-C_{2b}} \qquad \text{Eqn. 22}$$

$$\Rightarrow F_2 \left(1 - \frac{C_{1b} C_{2a}}{C_{1a} C_{2b}}\right) = \frac{F_3 \left(C_{3b} - \frac{C_{1b} C_{3a}}{C_{1a}}\right) + F_n \left(C_{nb} - \frac{C_{1b} C_{na}}{C_{1a}}\right)}{C_{2b}} \qquad \text{Eqn. 23}$$

$$\Rightarrow F_2 = \frac{F_3 (C_{1a} C_{3b} - C_{1b} C_{3a}) + F_n (C_{1a} C_{nb} - C_{1b} C_{na})}{C_{1b} C_{2a} - C_{2b} C_{1a}} \qquad \text{Eqn. 24}$$

Then using a third set of samples in which suffix 'c' denotes, for example, real parts from the 50 Hz bin, and substituting $F_1$ and $F_2$ from the equations above one obtains the equations shown in FIG. 9. Simplifying the equations provided so far one obtains the ratio of the transfer function of each of the live phases to the transfer function of the neutral phase:

$$\frac{F_3}{F_n} = K \qquad \text{Eqn. 25}$$

$$\frac{F_2}{F_n} = \frac{K_3(C_{1a} C_{3b} - C_{1b} C_{3a}) + (C_{1a} C_{nb} - C_{1b} C_{na})}{C_{1b} C_{2a} - C_{2b} C_{1a}} = K_2 \qquad \text{Eqn. 26}$$

$$\frac{F_1}{F_n} = \frac{K_2 C_{2a} + K_3 C_{3a} + C_{na}}{C_{1a}} = K_1 \qquad \text{Eqn. 27}$$

Then using the above equations on fresh data which is denoted below by suffix 'd' one now finds the load drawn current component of any output signal:

$$F_1 C_{1d} + F_2 C_{2d} + F_3 C_{3d} + F_n C_{nd} = 0 \qquad \text{Eqn. 28}$$

$$\Rightarrow -C_{nd} = K_1 C_{1d} + K_2 C_{2d} + K_3 C_{3d} \qquad \text{Eqn. 29}$$

Where one wishes to determine the transfer function F1 for the first current sensor 52 of FIG. 5, a known reference input signal is applied such that it is sensed by the first current sensor whereby the first output signal comprises a load output signal corresponding to the load drawn current signal and a reference output signal corresponding to the applied reference input signal. The load output signal is subtracted from the first output signal when the reference input signal is applied by way of the following to provide an equation for F1 in terms of known values and in which suffix 'x' denotes fresh measurement data lacking the reference output signal and suffix 'xr' denotes fresh measurement data comprising the reference output signal.

$$I_{1x} + I_{ref} = F_1 C_{1x} + F_1 C_{1ref} = F_1 C_{1xr} \qquad \text{Eqn. 30}$$

$$\Rightarrow C_{1xr} = C_{1x} + C_{1ref} = \frac{I_{1x} + I_{1ref}}{F_1} \qquad \text{Eqn. 31}$$

$$F_1 C_{1x} + F_2 C_{2x} + F_3 C_{3x} + F_n C_{nx} = 0 \qquad \text{Eqn. 32}$$

$$\Rightarrow F_2 C_{2x} + F_3 C_{3x} + F_n C_{nx} = -F_1 C_{1x} \qquad \text{Eqn. 33}$$

$$\Rightarrow \frac{K_2}{K_1} C_{2x} + \frac{K_3}{K_1} C_{3x} + \frac{1}{K_1} C_{nx} = C_{1x} \qquad \text{Eqn. 34}$$

$$C_{1xr} - C_{1x} = C_{1ref} = \frac{I_{1ref}}{F_1} \qquad \text{Eqn. 35}$$

$$\Rightarrow F_1 = \frac{I_{1ref}}{C_{1xr} - C_{1x}} = \frac{I_{1ref}}{C_{1xr} + \frac{K_2}{K_1} C_{2x} + \frac{K_3}{K_1} C_{3x} + \frac{1}{K_1} C_{nx}} \qquad \text{Eqn. 36}$$

The remaining transfer functions, i.e. F2, F3 and Fn, are then determined by way of the now determined transfer function for the first current sensor and the equations for the transfer function ratios specified above. In another embodiment and where the multi-phase electricity supply is a three-phase supply comprising first to third live phases and neutral, the current in one of the conductors is assumed to have a particular value whereby the transfer function ratios are determined on the basis of measurements made in respect of only three of the four conductors. For example and where there is no current measurement in respect of neutral the neutral conductor is assumed to have a value of zero.

Figure 10:
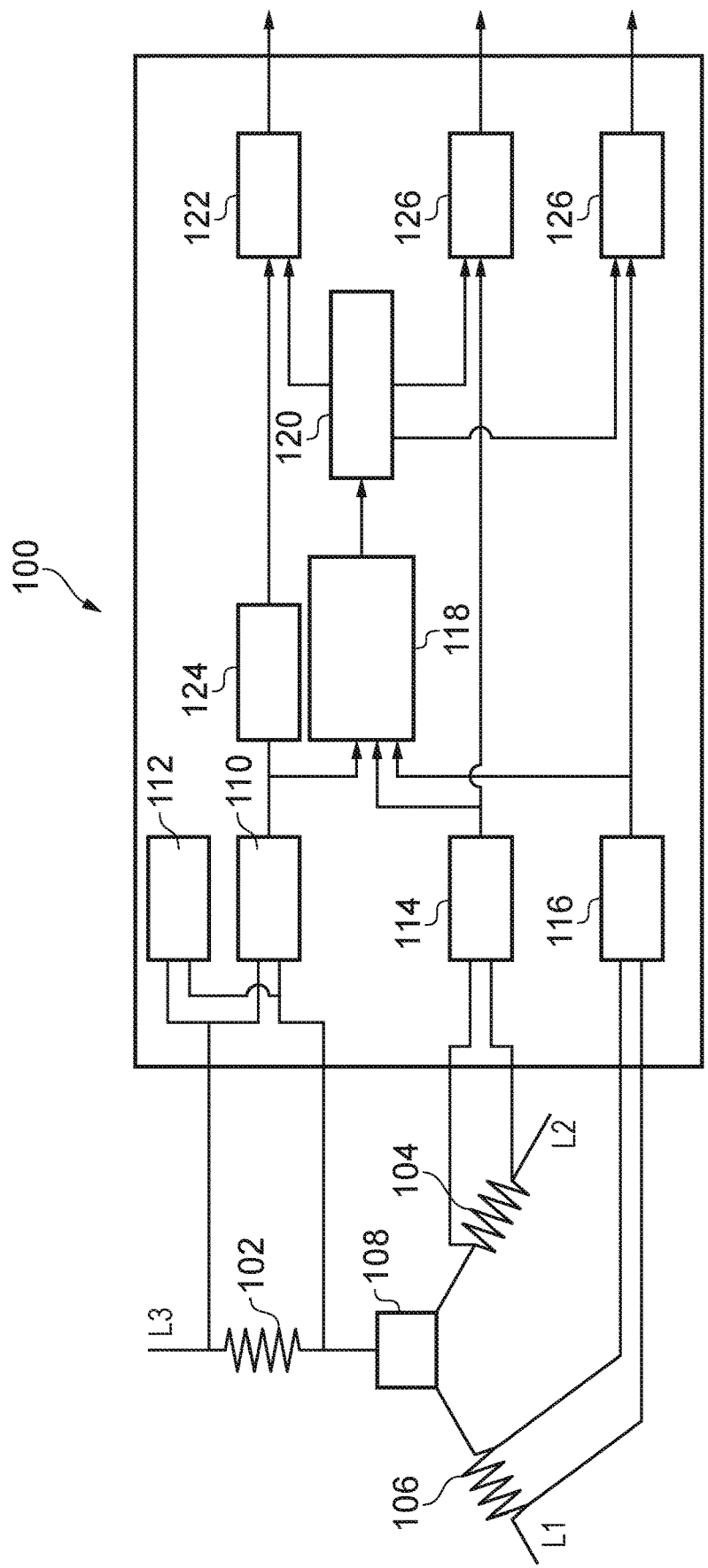
FIG. 10 is a block diagram representation of an embodiment of current measurement apparatus according to the present subject matter.

An example of a Current measurement apparatus which is used to measure current in the three phase configuration of FIG. 5 is shown in FIG. 10. The current measurement apparatus 100 comprises a first shunt resistor 102, a second shunt resistor 104 and a third shunt resistor 106 in a respective one of the conductors of a three phase arrangement. A load 108 draws electrical power from the three phase arrangement. The current measurement apparatus 100 further comprises first voltage measuring apparatus 110, which is operative to measure the voltage across the first shunt resistor 102, and a signal source 112, which is operative to apply a reference input signal to the conductor sensed by the first shunt resistor 102. The current measurement apparatus 100 also comprises second voltage measuring apparatus 114, which is operative to measure the voltage across the second shunt resistor 104, and third voltage measuring apparatus 116, which is operative to measure the voltage across the third shunt resistor 106. Each of the voltage measuring apparatus 110, 114, 116 is operative to provide for measurement of current in a respective one of the conductors as is described in detail in WO 2013/038176. The reader is directed to that publication in its entirety, but specifically to FIGS. 1a and 1b and the related description.

The signal source 112 is operative to apply a known or determinable reference input signal (it is to be noted that the reference input signal need not be predetermined) to a conductor such that the reference input signal is sensed by the first shunt resistor 102 whereby the voltage measured by the first voltage measuring apparatus 110 comprises a load output signal corresponding to the load drawn current signal and a reference output signal corresponding to the reference input signal. The reference output signal and the reference input signal provide for accurate measurement of current in the conductor and hence power consumption and also for determination of events such as tampering and fault conditions as described in more detail in WO 2013/038176.

A transfer function ratio determination module 118 comprised in a processor of the current measurement apparatus 100 receives an input from each of the first to third voltage measuring apparatus 110, 114, 116. The transfer function ratio determination module 118 is operative to calculate first and second transfer function ratios in accordance with the approach described above in the worked example. As specified above the transfer function ratios are calculated on the basis of measurement data which lacks a reference output signal. One or more of several approaches take account of the reference output signal. According to a first approach the signal source 112 is switched off such that no reference input signal is applied to the conductor sensed by the first shunt resistor 102. According to a second approach a reference input signal is applied to the conductor sensed by the first shunt resistor 102 and the transfer function ratio determination module 118 is operative on a part of the output signal measured in respect of the conductor that lacks the reference output signal. In this approach the signal source 112 is operative to apply a reference input signal having a different frequency profile to the load drawn current signal whereby frequency analysis by the transfer function ratio determination module 118 extracts the part of the output signal lacking the reference output signal from the rest of the output signal. According to a third approach the current measurement apparatus 100 is operative to at least reduce if not remove the reference output signal from the output signal. More specifically the current measurement apparatus 100 comprises a filter (not shown) which is operative to reduce if not remove the reference output signal from the output signal from the first voltage measuring apparatus 110. Alternatively the current measurement apparatus 100 is operative to apply a reference removing transfer function to reduce if not remove the reference output signal from the output signal from the first voltage measuring apparatus 110. Characteristics of the reference removing transfer function and filter are determined in dependence on knowledge of characteristics of the reference input signal. In one form of this approach the contribution of the reference input signal to the measured output signal is estimated with the transfer function ratio determination module 118 being operative to remove the reference output signal from the measured output signal in dependence on the estimated contribution. According to a fourth approach and where the reference input signal is applied as a square wave or the like, the transfer function ratio determination module 118 is operative to apply a window to the measured output signal to select a part of the output signal lacking the reference output signal. The use of a square wave or similar reference signal and a windowing function is described in WO 2014/191776.

In a form of the present subject matter the transfer function ratios are determined on an on-going basis. Under certain circumstances there may be no need to update all the data used to determine the transfer function ratios with only data provided by present measurements being updated. Data which are not updated in dependence on measurements are either previously measured data or estimated data. Furthermore determinations are made on an on-going basis in respect of measured load drawn current signal and electrical power consumed by determining the transfer functions on on-going basis. The determination of the transfer functions is described below.

The current measurement apparatus 100 further comprises a transfer function determining module 120 which receives an input from the transfer function ratio determination module 118. The transfer function determining module 120 is operative to determine the transfer function in respect of one of the conductors in accordance with the approach described above in the worked example. The transfer function is therefore determined in dependence on the known reference input signal, the already calculated transfer function ratios, fresh measurements from the second and third voltage measuring apparatus 114, 116, which lack the reference output signal, and fresh measurements from the first voltage measuring apparatus 112 which comprise the reference output signal. Having deter mined the transfer function in respect of one of the conductors the transfer function determining module 120 is then operative to determine the other two transfer functions in dependence on the transfer function ratios.

The current measurement apparatus 100 also comprises a first current calculation module 122 which receives the appropriate transfer function from the transfer function determining module 120 and an input from the first voltage measuring apparatus 110. Before being received by the first current calculation module 122 the output from the first voltage measuring apparatus 110 is processed by a reference output signal removing module 124 which is operative to remove the reference output signal from the output from the first voltage measuring apparatus 110 to thereby prevent the reference output signal contributing to measurement error. The form and function of the reference output signal removing module 124 is described in more detail in WO 2013/038176. In addition the current measurement apparatus 100 comprises second and third current calculation modules 126 which each receive an appropriate transfer function from the transfer function determining module 120 and an input from a respective one of the second and third voltage measuring apparatus 114, 116. Each of the first to third current calculation modules 122, 126 is operative to calculate the load drawn current in a respective one of the conductors in dependence on measurements received from a respective one of the first to third voltage measuring apparatus 110, 114, 116. Power consumption is then determined in dependence on the calculated the load drawn currents and voltage measured in respect of the conductors as is described in detail in WO 2013/038176. In addition the current measurement apparatus 100 is operative to determine events such as fault conditions or tampering in dependence on the determine transfer functions. The determining of such events is described in detail in WO 2013/038176. In a form of the present subject matter the current measurement apparatus 100 is operative to determine events in dependence on a change in a ratio of transfer functions. A change in a ratio of transfer functions which exceeds a threshold value may be indicative of a tamper or fault event and thus provides an alternative or additional approach to event determination.

Figure 11:
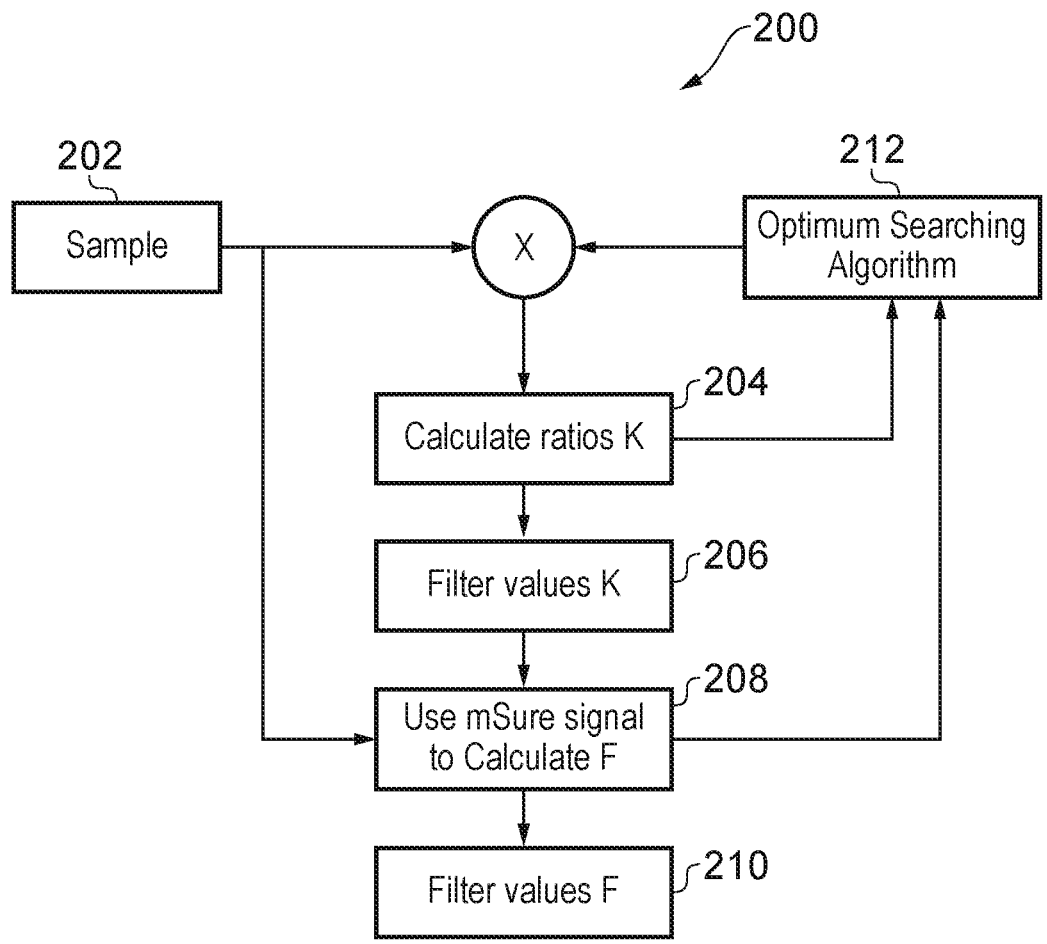
FIG. 11 represents the steps involved in a filtering in the present subject matter according to a best fit approach.
Figure 12:
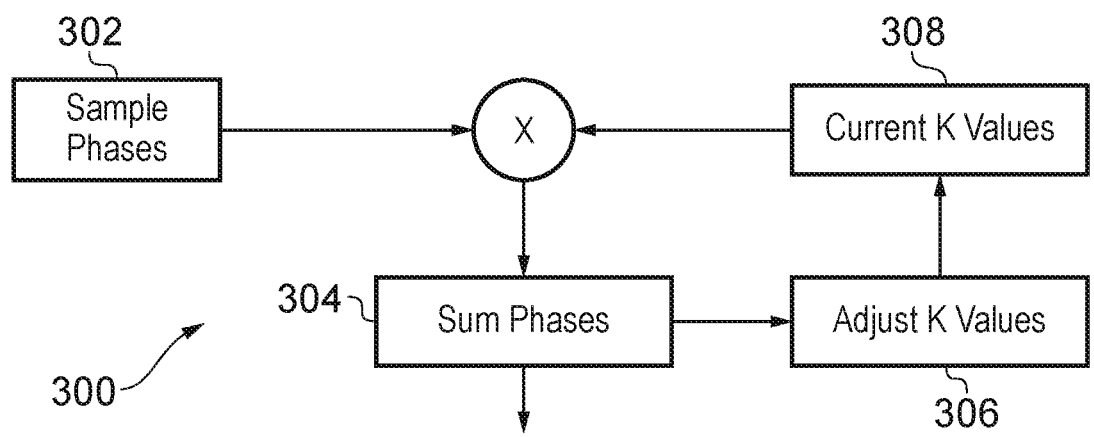
FIG. 12 represents providing for optimal determination of the transfer function ratios in dependence on an error minimisation approach.

The current measurement apparatus 100 is operative to filter the transfer function ratios and to filter the transfer function determined in dependence on filtered transfer function ratios. FIG. 11 represents the steps 200 involved in the filtering approach. Measurement data is received 202 and is used to determine the transfer function ratios 204. The determined transfer function ratios are then filtered 206 and thereafter the transfer function of one of the shunt resistors is determined 208 as described above in detail. Then the transfer function is filtered 210. The approach also involves feedback to provide for optimal determination of the transfer function. More specifically a best fit algorithm 212 receives the transfer function ratios as determined by step 204 and the transfer function as determined by step 208 and provides an output which is combined with the received measurement data 202. The best fit algorithm 212 is operative in accordance with a given approach such as the hill climb approach or by way of least mean squares filtering. The current measurement apparatus 100 is also operative to provide for optimal determination of the transfer function ratios in dependence on an error minimisation approach. The steps 300 involved in this approach are represented in FIG. 12. Measurement data is received 302 in respect of all of the conductors. Then the measurement data is summed 304 in accordance with the following equation:

$$F_1C_{1x}+F_2C_{2x}+F_3C_{3x}+F_nC_{nx}=0 \qquad \text{Eqn. 37}$$

$$\Rightarrow K_1C_{1x}+K_2C_{2x}+K_3C_{3x}C_{nx}=0 \qquad \text{Eqn. 38}$$

The error is reflected by a deviation from the ideal sum of zero which is represented in the above equation. The current measurement apparatus is therefore then operative to adjust the determined transfer function ratios 306 to bring the sum closer to zero. The adjusted transfer function ratios are then feedback 308 and combined with newly received measurement data.

Figure 14:
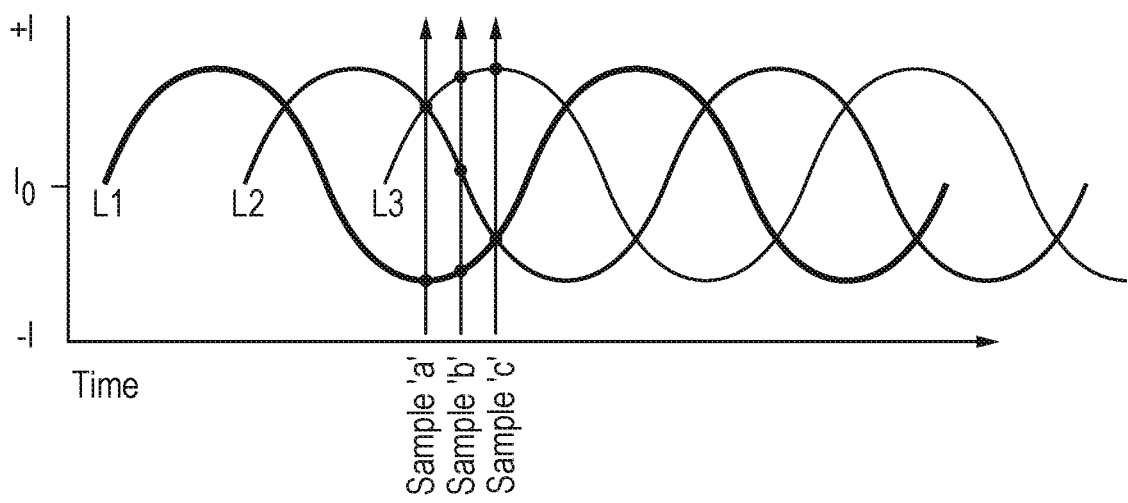
FIG. 14 illustrates how data from the time domain can be used to generate multiple independent equations.

As noted before, taking samples at different points of time in the time domain may also be exploited in the generation of suitable sets of independent equations to allow the ratio of the transfer functions to be calculated. FIG. 14 schematically represents the current flowing in three conductors L1, L2 and L3 of a 3 phase supply. Suppose a set of samples are taken at time "a". The digitized output codes representing the sample values are C1a, C2a and C3a for phases L1, L2 and L3, respectively. Taking a second sample at time "b" results in codes C1b, C2b, C3b. Samples C1c, C2c and C3c can be taken at time "c", and so on. This allows independent equations to be set up since C1a/C2a≠C1b/C2b.

The apparatus may be arranged to test that the equations are going to be independent before proceeding with calculation of the transfer function ratios and the transfer functions themselves. This can for example be done by testing that C1a/C2a≠C1b/C2b. The apparatus may also be arranged to check that the results will not be adversely impacted by noise or quantisation errors. This can be done by ensuring that ADC output values that are going to be used in further calculation have C1, C2 and C3 each with magnitude greater than a threshold value. The threshold value may be set by a user or a manufacturer.

It is thus possible to use the estimated transfer function ratios to improve the identification of the reference signal (effectively improving the signal to noise ratio of the reference signal) so as to allow the transfer characteristics of the current transducers to be determined with greater accuracy.

The claims presented herein have been written in single dependency format for use at the USPTO. However it is to be understood that each claim can be multiply dependent on any preceding claim unless that is clearly infeasible.

The invention claimed is:

1. A current measurement apparatus for use in a multi-phase electricity supply comprising:
   at least three current measurement transducers, a first one of the at least three current measurement transducers arranged in a state to add a known reference input signal to obtain a responsive output signal, in absence of requiring applying the reference input signal to a second and a third current measurement transducers of the at least three current measurement transducers;
   a data processor arranged to determine a ratio between at least two transfer functions of the at least three current measurement transducers;

wherein the known reference input signal is applied such that an output of the first current measurement transducer comprises a load current component and a reference signal component; and wherein respective output signals from the second and third current measurement transducers are used to estimate and remove the load current component from the first current measurement transducer output, leaving an estimated reference signal component to compare with the known reference input signal to characterize the transfer function of the first current measurement transducer.

2. The current measurement apparatus of claim 1, in which each transfer function is determined differently using at least one of
 a) real and imaginary parts of a measured current flow over at least one frequency range; and
 b) current flow measurements made at different times.

3. The current measurement apparatus of claim 1, in which the current measurement apparatus performs a frequency domain analysis, and uses measurements of in phase and out of phase components of current at one or more frequency ranges.

4. The current measurement apparatus of claim 1, further comprising a characterization apparatus for characterising the transfer function of at least one of the current measurement transducers to a specified accuracy.

5. The current measurement apparatus of claim 4, in which the characterization apparatus comprises a current supply for adding a first reference input signal that includes a first known time varying current to a current being measured by the first one of the current measurement transducers, and the data processor is configured for monitoring output of the first current measurement transducer, for extracting a signal component due to the known time varying current, and determine a transfer function of the first current measurement transducer by comparing the extracted signal of first known time varying current with the first known time varying current.

6. The current measurement apparatus of claim 1, comprising first, second and third current measurement transducers for measuring the current in first, second and third phases of the multiphase electricity supply.

7. The current measurement apparatus of claim 1, wherein the data processor is further arranged to determine the current flowing in each phase of the multiphase electricity supply.

8. The current measurement apparatus of claim 3, in which signals from the measurement transducers are transformed from the time domain to the frequency domain to provide estimates of the in phase and out of phase components of the measured current at a plurality of frequency bins, and the data processor is arranged to solve a plurality of independent equations in which for two or more frequency bins the sum of in phase parts of the measured current is zero and the sum of the out of phase parts of the measured current is zero.

9. The current measurement apparatus of claim 1, in which the data processor is arranged to perform a time domain analysis, wherein the data processor is arranged to apply plural different time windows to the measured output signals to identify a change in loading of the multiphase electricity supply.

10. The current measurement apparatus of claim 9, in which one of the following applies:
 a) the change in load is expected to take place from cycle to cycle of an AC current, and the time windows span multiple cycles of the AC current; or
 b) the change in load current is expected to take place within a cycle of the AC current and the time windows are within one cycle of the AC current.

11. The current measurement apparatus of claim 1, included in a power consumption meter including at least one voltage measurement apparatus for measuring a voltage and an accumulator for accumulating a sum at a given time of products of the voltage and the current.

12. The current measurement apparatus of claim 5, in which the current measurement apparatus is further configured to apply a second reference signal that includes a second known time varying current to a second one of the current transducers, and where the first and second known time varying currents can be applied at different times, or the first and second time varying currents have differing characteristics and are applied concurrently.

13. The current measurement apparatus of claim 1, in which the data processor is further arranged to determine a measure of confidence in the data used to estimate a transfer function ratio or in an estimate of a transfer ratio and its measure of confidence are used in response to updating an estimate of the transfer function ratio.

14. The current measurement apparatus of claim 1, in which the transducers are selected from one or more of shunt resistors, current transformers, Rogowski coils, Hall probes, and magnetoresistors.

15. The current measurement apparatus of claim 5, in which the data processor is arranged to subtract a signal corresponding to the first load current measured by the first transducer so as to make the contribution due to the reference signal that includes the first known time varying current easier to measure, the first load current signal being estimated using knowledge of the transfer functions of other ones of the current sensors.

16. The current measurement apparatus of claim 1, in which the characterization apparatus is configured to use the arranged state to use Kirchoff's law of current flow to compare plural measurements of current and determine the ratio of the transfer functions.

17. A method of correcting current transducer mismatch in a multiphase electricity supply where a first load current flows in a first supply conductor, a second load current flows in a second supply conductor and a third load current flows in a third supply conductor, the method comprising:
 adding a known reference input signal to the first load current in absence of requiring applying the reference input signal to at least one of the second and third load currents;
 using at least three current measurement transducers, a first one of the least three current measurement transducers arranged in a state to receive the known reference input signal to obtain a responsive output signal in absence of requiring applying the reference input signal to a second current measurement transducer and a third current measurement transducer of the at least three current measurement transducers;
 determining a ratio between at least two transfer functions of the first, second and third current measurement transducers measuring the first, second and third load currents, respectively, including using respective output signals of the second and third current measurement transducers; and
 wherein the known reference input signal is applied to a first current path such that an output of the first current measurement transducer comprises a load current component and a reference signal component, and wherein respective output signals from the second and third current measurement transducers are used to estimate and remove the load current component from the first current measurement transducer output, leaving an estimated reference signal component to compare with the known reference input signal to characterize the transfer function of the first current measurement transducer.

18. A current measurement method comprising:

measuring by way of a measurement arrangement a load drawn current signal in each of at least three conductors of a multiphase electricity supply to provide a respective output signal;

applying a reference input signal to the measurement arrangement wherein the output signal measured in respect of a conductor comprises a load output signal corresponding to the load drawn current signal in the conductor and a reference output signal corresponding to the reference input signal;

determining at least first and second transfer function ratios, the first transfer function ratio being determined in respect of a first pair of conductors and the second transfer function ratio being determined in respect of a second pair of conductors, the at least first and second transfer function ratios being determined in dependence on at least a part of each of output signals measured in respect of the at least three conductors and which lacks a reference output signal, each transfer function ratio being determined differently from the at least one other transfer function ratio in respect of at least one of real and imaginary parts in at least one frequency band and time window of the output signals; and making a determination in respect of at least one of:

a measured load drawn current signal; and electrical power consumed by the at least one load, the determination being made in dependence on the at least first and second transfer function ratios, the reference input signal and at least a part of output signals measured in respect of the conductors and comprising reference output signals.

19. The method of claim 18, further comprising removing the reference output signal from the output of a current sensor before using the output to estimate the electrical power consumed by a load.

20. The method of claim 18, further comprising estimating a load component representing a load current at a sensor output and subtracting the load component, leaving an estimated reference output signal.

* * * * *

UNITED STATES PATENT AND TRADEMARK OFFICE
CERTIFICATE OF CORRECTION

PATENT NO. : 10,845,393 B2
APPLICATION NO. : 15/700867
DATED : November 24, 2020
INVENTOR(S) : Hurwitz et al.

Page 1 of 1

It is certified that error appears in the above-identified patent and that said Letters Patent is hereby corrected as shown below:

On the Title Page

Item (73), in "Assignee", in Column 1, Line 1, delete "Limited" and insert --Unlimited-- therefor Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*